United States Patent
Sakamoto et al.

(10) Patent No.: US 8,435,721 B2
(45) Date of Patent: May 7, 2013

(54) RESIST UNDERLAYER FILM FORMING COMPOSITION AND FORMING METHOD OF RESIST PATTERN USING THE SAME

(75) Inventors: Rikimaru Sakamoto, Toyama (JP); Takafumi Endo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 358 days.

(21) Appl. No.: 12/866,831

(22) PCT Filed: Feb. 19, 2009

(86) PCT No.: PCT/JP2009/052905
§ 371 (c)(1),
(2), (4) Date: Aug. 9, 2010

(87) PCT Pub. No.: WO2009/104685
PCT Pub. Date: Aug. 27, 2009

(65) Prior Publication Data
US 2011/0059404 A1    Mar. 10, 2011

(30) Foreign Application Priority Data

Feb. 21, 2008    (JP) ................................ 2008-039900

(51) Int. Cl.
*G03F 7/11*    (2006.01)
*C08G 59/42*    (2006.01)
*H01L 21/027*    (2006.01)

(52) U.S. Cl.
USPC ......... 430/311; 430/271.1; 252/582; 528/112

(58) Field of Classification Search .................... None
See application file for complete search history.

(56) References Cited

U.S. PATENT DOCUMENTS

| 2004/0101779 A1 | 5/2004 | Wu et al. |
|---|---|---|
| 2004/0175646 A1 | 9/2004 | Hatanaka et al. |
| 2008/0038678 A1 | 2/2008 | Kishioka et al. |
| 2008/0138744 A1 | 6/2008 | Hatanaka et al. |
| 2008/0268379 A1 | 10/2008 | Sakamoto |

FOREIGN PATENT DOCUMENTS

| EP | 1 757 986 A1 | 2/2007 |
|---|---|---|
| EP | 1 876 495 A1 | 1/2008 |
| JP | B2-2-61956 | 12/1990 |
| JP | A-2000-159772 | 6/2000 |
| JP | 2003-192685 | 7/2003 |
| JP | A-2003-345027 | 12/2003 |
| JP | A-2005-321752 | 11/2005 |
| JP | A-2006-507521 | 3/2006 |
| JP | A-2007-2045 | 1/2007 |
| WO | WO 03/011974 A1 | 2/2003 |
| WO | WO 03/017002 A1 | 2/2003 |
| WO | WO 2005/098542 A1 | 10/2005 |
| WO | WO 2005/111724 A1 | 11/2005 |
| WO | WO 2006/115074 A1 | 11/2006 |
| WO | WO 2008/017954 A2 | 2/2008 |
| WO | WO 2008/139320 A2 | 11/2008 |

OTHER PUBLICATIONS

Supplementary European Search Report for corresponding European Patent Application No. 09712004.2, mailed on Feb. 8, 2011.
International Search Report in International Application No. PCT/JP2009/052905, dated Mar. 17, 2009.

*Primary Examiner* — Cynthia Hamilton
(74) *Attorney, Agent, or Firm* — Oliff & Berridge, PLC

(57) ABSTRACT

It is an object to provide a resist underlayer film forming composition having a large selection ratio of a dry etching rate, and having a k value and an n value at a short wavelength such as an ArF excimer laser, both of which exhibit desired values. There is provided a resist underlayer film forming composition containing a polymer obtained by reacting at least a tetracarboxylic dianhydride having an alicyclic structure or an aliphatic structure and a diepoxy compound having two epoxy groups with an organic solvent containing an alcohol-based compound having an OH group, and a solvent.

19 Claims, No Drawings

RESIST UNDERLAYER FILM FORMING COMPOSITION AND FORMING METHOD OF RESIST PATTERN USING THE SAME

TECHNICAL FIELD

The present invention relates to a composition useful for forming a resist underlayer film between a substrate and a resist film formed on the substrate in order to obtain a resist pattern in a desired shape in a lithography process which is a process for the production of semiconductor devices. The present invention also relates to a resist underlayer film forming composition suitable for a lithography process using an immersion exposure apparatus. A resist underlayer film capable of suppressing an influence of a reflected wave on a resist film during the exposure of the resist film can also be called an anti-reflective film.

BACKGROUND ART

There is known an anti-reflective film forming composition used in a lithography process using an ArF excimer laser having a wavelength of about 193 nm as a light source (see Patent Document 1). Patent Document 1 discloses a composition containing an acrylic resin which is a copolymer having each of a benzene ring, a lactone ring, and a hydroxyalkyl group independently in its side chains.

In addition, there is known an anti-reflective film forming composition using a resin derived from tetracarboxylic dianhydride such as pyromellitic dianhydride containing in the polymer backbone of the resin, an aromatic compound having high absorptivity (low transparency) at a wavelength of 193 nm (see Patent Document 2). However, there is neither described nor indicated a polymer in which a derivative having high transparency at a wavelength of 193 nm and using an alicyclic or aliphatic tetracarboxylic dianhydride is introduced into the backbone of the polymer. Further, Patent Document 3 discloses an anti-reflective film forming composition containing a polymer obtained by reacting at least an aliphatic tetracarboxylic dianhydride with diols.

Patent Document 1: International Publication No. WO 03/017002 pamphlet
Patent Document 2: Japanese Translation of PCT International Application No. JP-A-2006-507521
Patent Document 3: International Publication No. WO 2008/017954 pamphlet

DISCLOSURE OF THE INVENTION

Problems to be Solved by the Invention

In the case of adopting an immersion lithography process, when the number of apertures (NA) of a projection lens of an immersion exposure apparatus becomes larger, a resist underlayer film having a high attenuation coefficient (also called k value or absorptivity) is undesirable, rather a low k value is considered to be effective, for controlling the reflection of an incident wave. For setting the k value low, a copolymerization of a polymer with a monomer having high transparency is effective. As a monomer having high transparency at 193 nm which is a wavelength for exposure, there are known aliphatic hydrocarbon compounds having a large number of carbon atoms such as adamantane and norbornene. When such a monomer is used for a resist underlayer film forming composition, a film formed from the composition may cause a trouble of lowering the dry etching rate of the film.

The resist underlayer film is required to have a dry etching rate larger (a selection ratio of dry etching rate larger) than that of a resist film. However, a conventional resist underlayer film formed from an acrylic or methacrylic resin-containing composition is not necessarily satisfactory in terms of dry etching rate. A cause of this disadvantage is considered to be that a carbon-carbon bond (C—C bond) constituting the backbone of an acrylic resin or methacrylic resin is not easily broken by dry etching.

It is an object of the present invention to provide a resist underlayer film forming composition containing a polymer obtained using as a raw material, a monomer having high transparency for lowering the k value, having a large selection ratio of a dry etching rate, and having a k value and a refractive index (n value) at a short wavelength such as an ArF excimer laser, both of which exhibit desired values. It is another object of the present invention to obtain a resist underlayer film forming composition with which a resist pattern formed on a resist underlayer film can be formed in a desired shape. Needless to say, the composition of the present invention is required to be insoluble in a solvent of a resist applied on the resist underlayer film formed, and not to cause intermixing between the resist underlayer film formed and the resist film.

Means for Solving the Problems

The present invention is a resist underlayer film forming composition for lithography containing a polymer obtained by reacting at least a tetracarboxylic dianhydride (alicyclic or aliphatic tetracarboxylic dianhydride) having an alicyclic structure or an aliphatic structure and a diepoxy compound having two epoxy groups with an organic solvent containing an alcohol-based compound having an OH group (excluding diols or a similar compound having two or more OH groups), and a solvent. The polymer is a two-dimensional polymer or a linear polymer and the backbone thereof has an ester bond, that is, —C(=O)—O— or —O—C(=O)—. The polymer in the present invention means a polymer that is not a monomer and from the polymer, a so-called oligomer is not excluded.

The polymer contained in the composition of the present invention has a repeating structure of Formula (1):

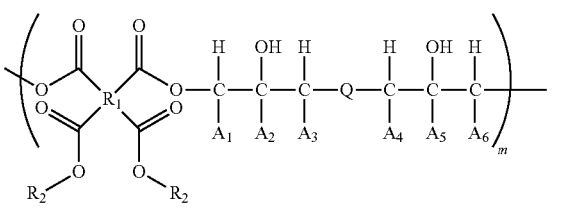

(where $A_1$, $A_2$, $A_3$, $A_4$, $A_5$, and $A_6$ are independently a hydrogen atom, a methyl group, or an ethyl group; Q is a divalent organic group; $R_1$ is a $C_{4-20}$alicyclic structure or aliphatic structure; $R_2$ is a $C_{1-13}$alkyl group, a $C_{3-13}$cycloalkyl group, or a $C_{1-13}$alkyl group substituted with at least one group selected from a group consisting of a $C_{1-13}$alkoxy group, a $C_{2-13}$alkylcarbonyloxy group, a $C_{2-13}$alkoxycarbonyl group, a $C_{1-13}$alkylthio group, a nitro group, a $C_{1-13}$alkylsulfonyloxy group, and a $C_{1-13}$alkoxysulfonyl group; and m is the number of repeating units of 5 to 300).

The number m of repeating units is, for example, 10 or more and 300 or less.

Here, the polymer may contain a structural unit other than that of Formula (1). The main repeating structure of Formula (1) and optional structural units are arranged linearly to constitute a polymer.

Furthermore, the polymer contained in the composition of the present invention is a polymer containing structural units of Formula (28) and Formula (29):

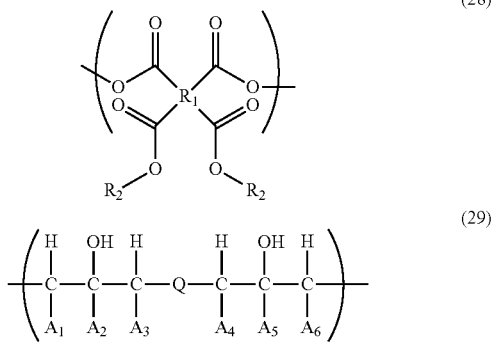

(28)

(29)

(in Formula (28), $R_1$ is a $C_{4-20}$alicyclic structure or aliphatic structure; $R_2$ is a $C_{1-13}$alkyl group, a $C_{3-13}$cycloalkyl group, or a $C_{1-13}$alkyl group substituted with at least one group selected from a group consisting of a $C_{1-13}$alkoxy group, a $C_{2-13}$alkylcarbonyloxy group, a $C_{2-13}$alkoxycarbonyl group, a $C_{1-13}$alkylthio group, a nitro group, a $C_{1-13}$alkylsulfonyloxy group, and a $C_{1-13}$alkoxysulfonyl group, and in Formula (29), $A_1$, $A_2$, $A_3$, $A_4$, $A_5$, and $A_6$ are independently a hydrogen atom, a methyl group, or an ethyl group; and Q is a divalent organic group).

Here, the polymer may contain a structural unit other than those of Formula (28) and Formula (29).

The main structural units of Formula (28) and Formula (29) and optional structural units are arranged linearly to constitute a polymer.

In Formula (1) or Formula (29), Q is a group of Formula (2):

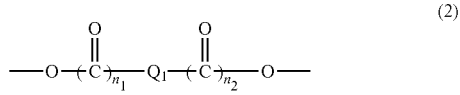

(2)

(where $Q_1$ is a $C_{1-10}$alkylene group, a divalent organic group having a $C_{3-10}$alicyclic hydrocarbon, a phenylene group, a naphthylene group, or an anthrylene group, where the phenylene group, the naphthylene group, and the anthrylene group each may be substituted with at least one group selected from a group consisting of a $C_{1-6}$alkyl group, a halogen atom, a $C_{1-6}$ alkoxy group, a nitro group, a cyano group, and a $C_{1-6}$alkylthio group; and $n_1$ and $n_2$ are independently a number of 0 or 1).

In Formula (1) or Formula (29), Q is a group of Formula (3):

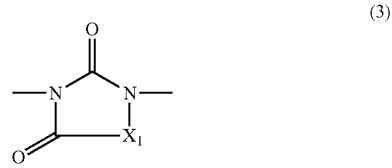

(3)

[where $X_1$ is a divalent group of Formula (4) or Formula (5):

(4)

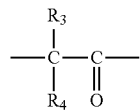

(5)

(where $R_3$ and $R_4$ are independently a hydrogen atom, a $C_{1-6}$alkyl group, a $C_{3-6}$alkenyl group, a benzyl group, or a phenyl group, where the phenyl group may be substituted with at least one group selected from a group consisting of a $C_{1-6}$alkyl group, a halogen atom, a $C_{1-6}$alkoxy group, a nitro group, a cyano group, and a $C_{1-6}$alkylthio group, or $R_3$ and $R_4$ may be bonded to each other to form a $C_{3-6}$ ring)].

The repeating structure of Formula (1) or the structural unit of Formula (29) may further have besides a unit structure in which Q is a group of Formula (3), a unit structure in which Q is a group of Formula (2).

Furthermore, in Formula (1) or Formula (29), Q is a group of Formula (6):

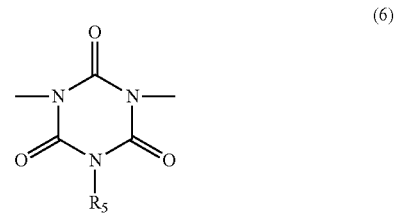

(6)

(where $R_5$ is a $C_{1-6}$alkyl group, a $C_{3-6}$alkenyl group, a benzyl group, or a phenyl group, where the phenyl group may be substituted with at least one group selected from a group consisting of a $C_{1-6}$alkyl group, a halogen atom, a $C_{1-6}$alkoxy group, a nitro group, a cyano group, and a $C_{1-6}$alkylthio group).

The repeating structure of Formula (1) or the structural unit of Formula (29) may further have besides a unit structure in which Q is a group of Formula (6), a unit structure in which Q is a group of Formula (2).

In the present invention, the alkyl group is not limited to a straight chain alkyl group, but may be a branched alkyl group, and examples thereof include a methyl group, an ethyl group, an isopropyl group, a tert-butyl group, and an n-hexyl group. Examples of the cycloalkyl group include a cyclobutyl group, a cyclopentyl group, and a cyclohexyl group. Examples of the alkylene group include a methylene group, an ethylene group, an n-propylene group, an n-pentylene group, an n-octylene group, a 2-methylpropylene group, and a 1,4-dimethylbutylene group. Examples of the alicyclic hydrocarbon include cyclobutane, cyclohexane, and adamantane. Examples of the alkoxy group include a methoxy group, an ethoxy group, an n-pentyloxy group, and an isopropoxy group. Examples of the alkylthio group include a methylthio group, an ethylthio group, an n-pentylthio group, and an isopropylthio group. Examples of the alkenyl group include a vinyl group, a 1-propenyl group, a 2-propenyl group (allyl group), a 1-methyl-2-propenyl group, a 1-butenyl group, a 2-butenyl group, and a 3-butenyl group. The alkylene group, alkoxy group, and alkylthio group are not limited to a straight chain group and may also have a branched structure or a cyclic structure. Examples of the halogen atom include a fluorine atom, a chlorine atom, a bromine atom, and an iodine atom.

$R_1$ is not particularly limited so long as $R_1$ has an alicyclic structure or an aliphatic structure. However, preferred examples of $R_1$ having an alicyclic structure include cyclobutane, cyclopentane, cyclohexane, bicycle[2,2,2]octo-7-ene, and bicyclo[3,3,0]octane.

The polymer having a repeating structure of Formula (1) or the polymer containing structural units of Formula (28) and Formula (29) is a product of a reaction between at least one type of compound of Formula (7) below, at least one type of compound of Formula (8) below, and at least one type of compound of Formula (9) below.

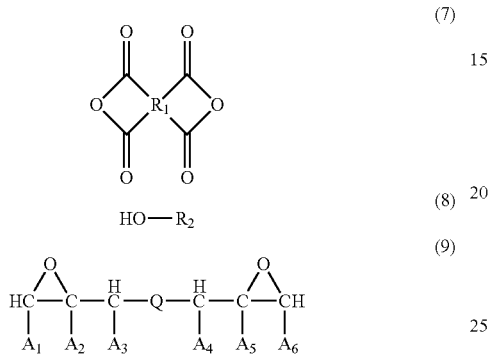

(where $R_1$ is a $C_{4-20}$alicyclic structure or aliphatic structure; $R_2$ is a $C_{1-13}$alkyl group, a $C_{3-13}$cycloalkyl group, or a $C_{1-13}$alkyl group substituted with at least one group selected from a group consisting of a $C_{1-13}$alkoxy group, a $C_{2-13}$alkylcarbonyloxy group, a $C_{2-13}$alkoxycarbonyl group, a $C_{1-13}$alkylthio group, a nitro group, a $C_{1-13}$alkylsulfonyloxy group, and a $C_{1-13}$alkoxysulfonyl group; $A_1$, $A_2$, $A_3$, $A_4$, $A_5$, and $A_6$ are independently a hydrogen atom, a methyl group, or an ethyl group; and Q is a divalent organic group).

In other words, the polymer having a repeating structure of Formula (1) or the polymer containing structural units of Formula (28) and Formula (29) can be obtained by dissolving at least one type of compound of Formula (7) and at least one type of compound of Formula (9) in an organic solvent containing at least one type of compound of Formula (8) in a large excessive amount so as to have an appropriate molar ratio and by subjecting the resultant solution to the polymerization in a presence of a catalyst activating an epoxy group. Examples of the catalyst activating an epoxy group include quaternary phosphonium salts such as ethyltriphenylphosphonium bromide and quaternary ammonium salts such as benzyltriethylammonium chloride. The catalyst may be used in an appropriate amount selected from a range of 0.1 to 10% by mass, based on the total mass of the compound of Formula (7) used and the compound of Formula (9) used. The temperature and time for the polymerization reaction may be selected from ranges of 80 to 160° C. and 2 to 50 hours as the optimal conditions.

Specific examples of the compound of Formula (7) include compounds of Formulae (7-a) to (7-e):

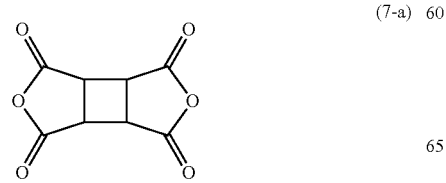

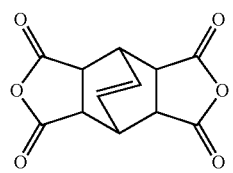

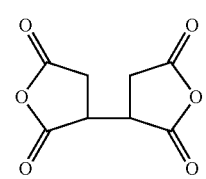

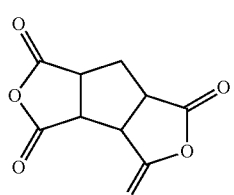

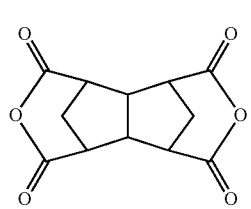

However, the specific examples are not limited to these compounds. Among these examples, more preferred are tetracarboxylic dianhydrides of Formula (7-c) and Formula (7-d) and further preferred is a tetracarboxylic dianhydride of Formula (7-d). This is because the molecular weight distribution of the polymer as the reaction product of the polymerization becomes stable, and peaks exhibited by a measurement result of gel permeation chromatography (GPC) can be obtained substantially in a form of Gauss distribution.

Specific examples of the compound of Formula (8) include compounds of Formulae (8-a) to (8-o):

However, the specific examples are not limited to these compounds. Among these examples, more preferred is propylene glycol monomethyl ether (PGME) of Formula (8-o). This is because PGME can be used as simultaneously both a reactant and a solvent when the polymer (reaction product) is obtained by the polymerization, and the obtained polymer is a compound in which PGME is added to side chains of the polymer, so that the solubility of the polymer in a solvent such as PGME and propylene glycol monomethyl ether acetate (PGMEA) becomes extremely excellent. PGME has a relatively high oxygen content and thus has an effect of not lowering the selection ratio of a dry etching rate described below.

In Formula (9), Q is a group of Formula (10):

$$-O-(C)_{n_1}-Q_1-(C)_{n_2}-O- \quad (10)$$

(where $Q_1$ is a $C_{1-10}$alkylene group, a divalent organic group having a $C_{3-10}$ alicyclic hydrocarbon, a phenylene group, a naphthylene group, or an anthrylene group, where the phenylene group, the naphthylene group, and the anthrylene group each may be substituted with at least one group selected from a group consisting of a $C_{1-6}$alkyl group, a halogen atom, a $C_{1-6}$alkoxy group, a nitro group, a cyano group, and a $C_{1-6}$alkylthio group; and $n_1$ and $n_2$ are independently a number of 0 or 1).

Examples of the compound of Formula (9) include a compound of Formula (11):

$$(11)$$

(where Y is a $C_{1-6}$alkyl group, a halogen atom, a $C_{1-6}$alkoxy group, a nitro group, a cyano group, or a $C_{1-6}$alkylthio group; and m is an integer of 0 to 4, where when m is 2 to 4, each Y may be the same as or different from each other).

In Formula (9), Q is a group of Formula (12):

$$(12)$$

(where $R_5$ is a $C_{1-6}$alkyl group, a $C_{3-6}$alkenyl group, a benzyl group, or a phenyl group, where the phenyl group may be substituted with at least one group selected from a group consisting of a $C_{1-6}$alkyl group, a halogen atom, a $C_1$alkoxy group, a nitro group, a cyano group, and a $C_{1-6}$alkylthio group).

The compound of Formula (9) preferably has a structure symmetric with respect to the structure Q, and specific examples of the compound of Formula (9) include compounds of Formulae (9-a) to (9-h):

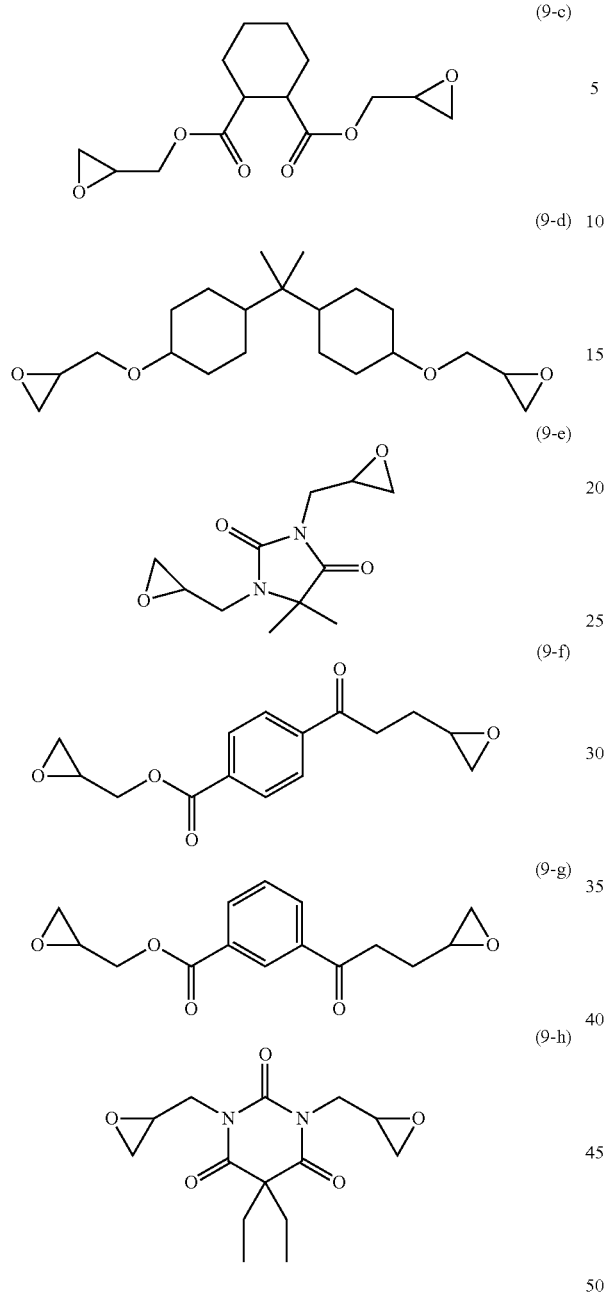

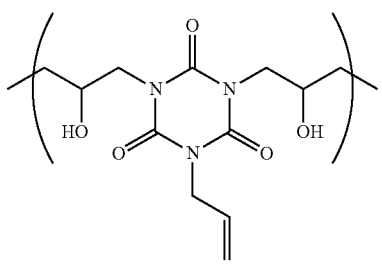

(13)

a

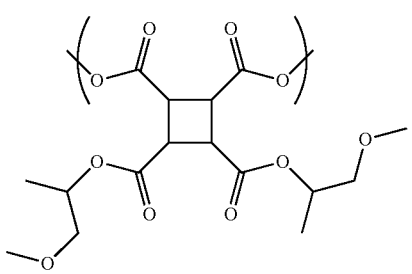

b
a:b = 1:1

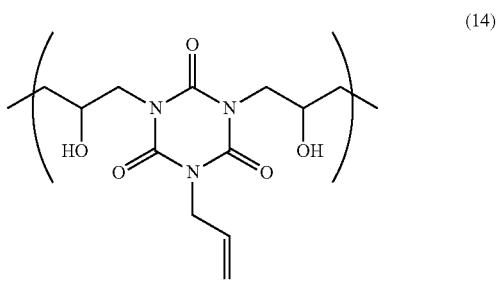

(14)

a

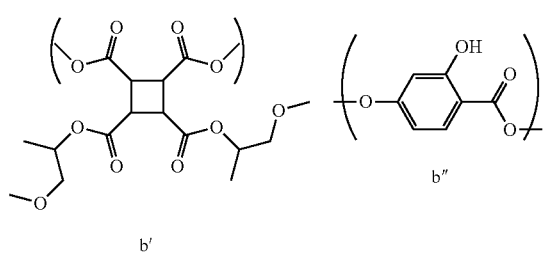

b' a:(b' + b'') = 1:1

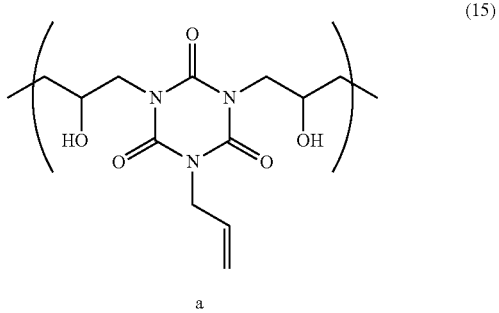

(15)

a

However, the specific examples are not limited to these compounds.

The polymer of the present invention may also be a reaction product obtained by adding besides the compounds of Formulae (7) to (9), other compounds having a polymerizable group to the mixture so long as the effect of the present invention is not impaired and by reacting the resultant mixture.

Particularly by adding other compounds having a functional group contributing to the absorption at a specific wavelength to the mixture, the k value at a specific wavelength can be controlled, and examples of the compound having a unit contributing to the absorption at a wavelength of 193 nm include 2,4-dihydroxybenzoic acid.

Examples of the structural unit of the linear polymer contained in the composition of the present invention include structural units of Formulae (13) to (27):

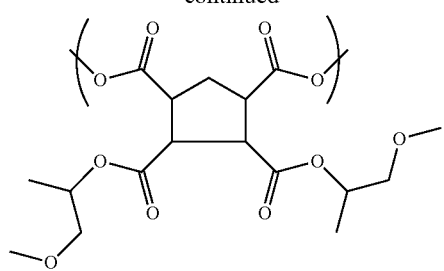
b
a:b = 1:1
(16)
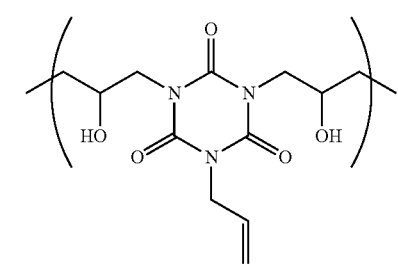
a
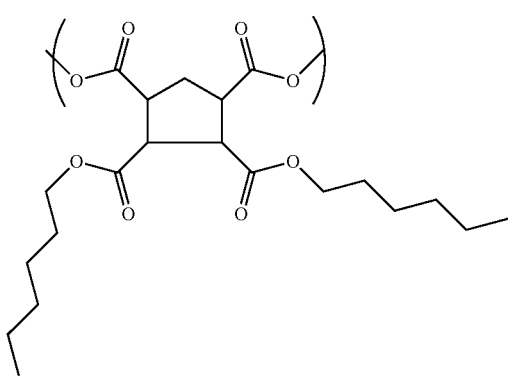
b
a:b = 1:1
(17)
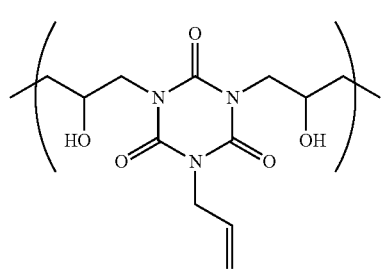
a
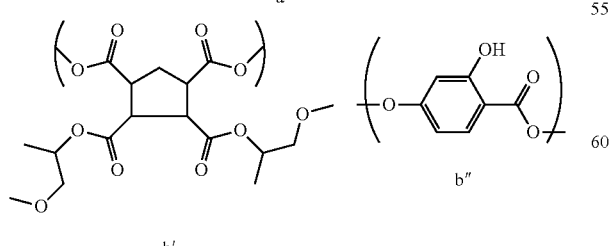
b'  b''
a:(b' + b'') = 1:1
(18)
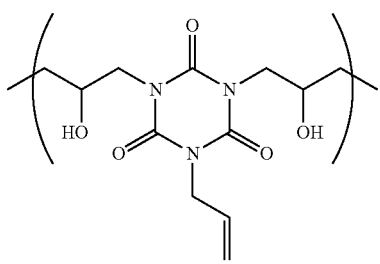
a
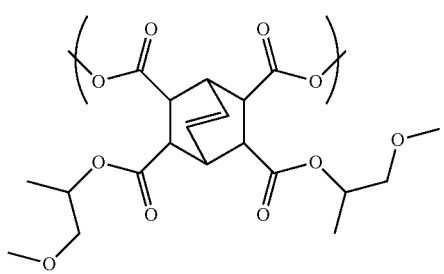
b
a:b = 1:1
(19)
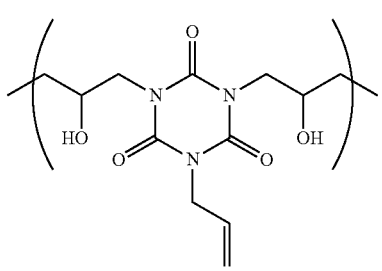
a
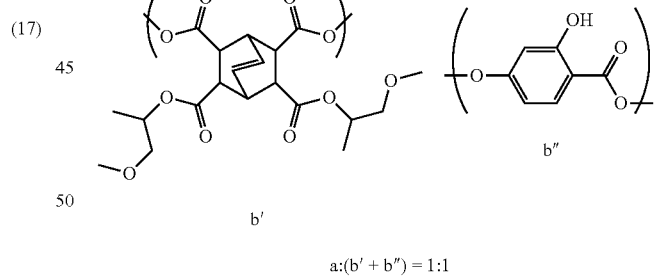
b'  b''
a:(b' + b'') = 1:1
(20)
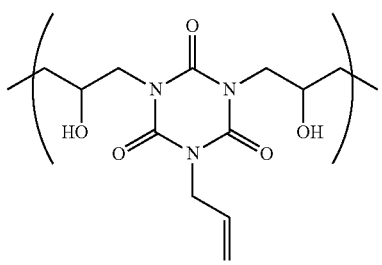
a

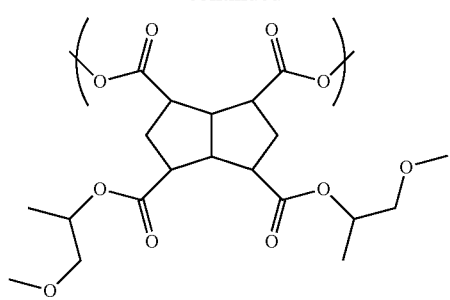
a:b = 1:1
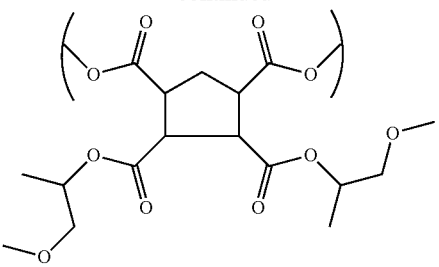
(a' + a"):b = 1:1
(21)
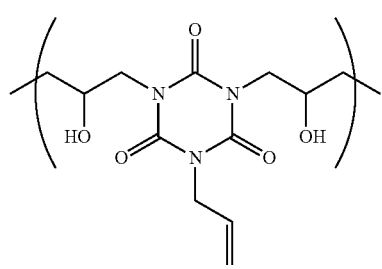
a
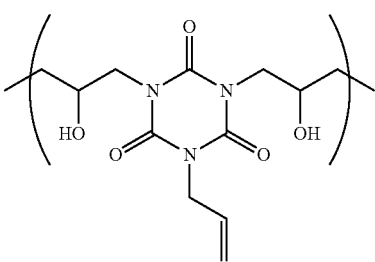
a'
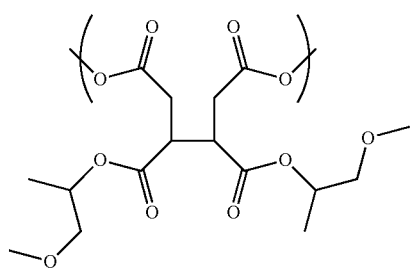
a:b = 1:1
(23)
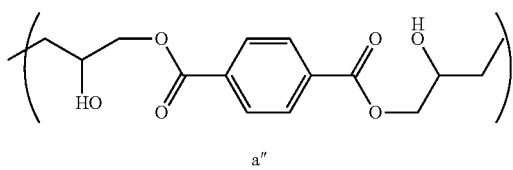
a"
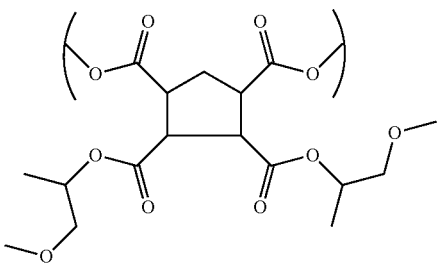
(a' + a"):b = 1:1
(22)
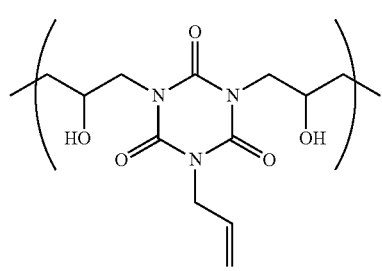
a'
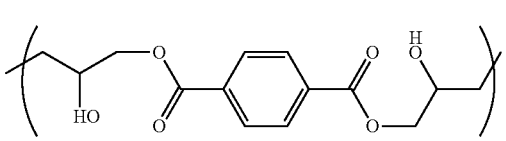
(24)
a'
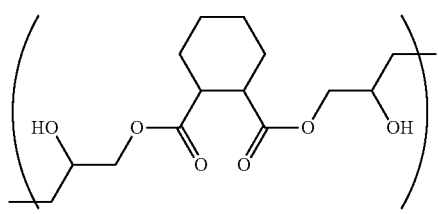
a"
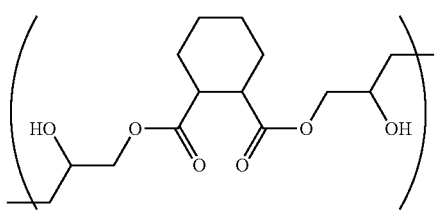
a"

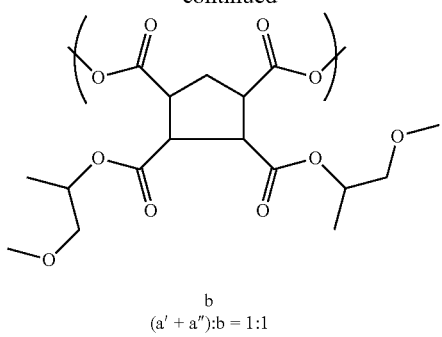

b
(a' + a''):b = 1:1

(25)

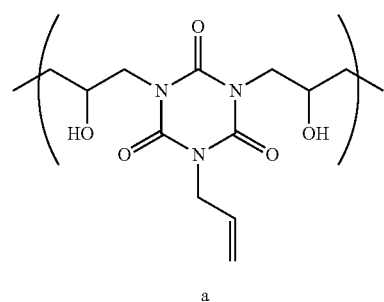

a

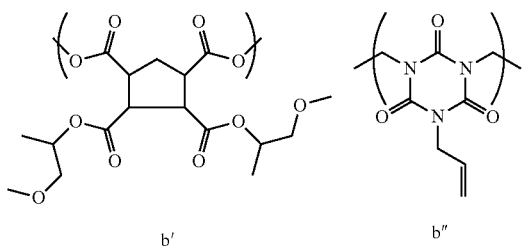

a:(b' + b'') = 1:1

(26)

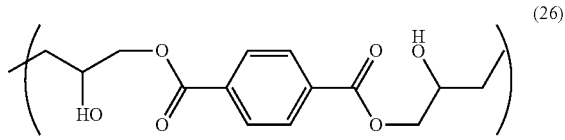

a

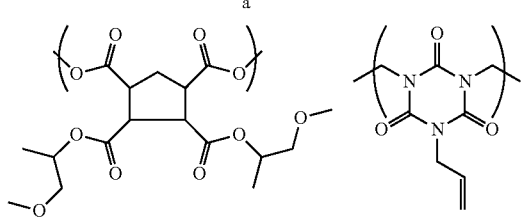

a:(b' + b'') = 1:1

(27)

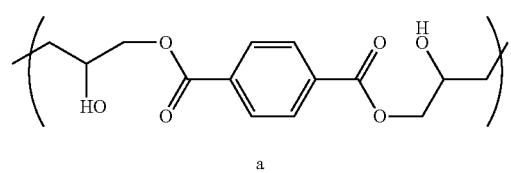

a

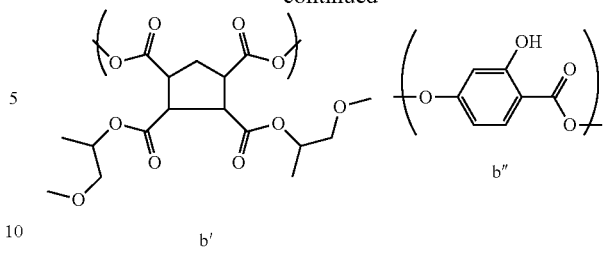

a:(b' + b'') = 1:1

However, the examples are not limited to these structural units.

For example, a polymer having a structural unit of Formula (13) can be obtained by polymerizing a compound of Formula (7-a) which is a specific example of the compound of Formula (7), a compound of Formula (8-0) which is a specific example of the compound of Formula (8), and a compound of Formula (9-a) which is a specific example of the compound of Formula (9), which are used as raw materials.

A polymer having a structural unit of Formula (17) can be obtained by polymerizing a compound of Formula (7-d) which is a specific example of the compound of Formula (7), a compound of Formula (8-o) which is a specific example of the compound of Formula (8), a compound of Formula (9-a) which is a specific example of the compound of Formula (9), and 2,4-dihydroxybenzoic acid, which are used as raw materials.

A polymer having a structural unit of Formula (23) can be obtained by polymerizing a compound of Formula (7-d) which is a specific example of the compound of Formula (7), a compound of Formula (8-o) which is a specific example of the compound of Formula (8), and two types of compounds of Formula (9) (a compound of Formula (9-a) and a compound of Formula (9-0), which are used as raw materials.

In Formula (13), Formula (15), Formula (16), Formula (18), Formula (20), and Formula (21), a molar ratio between a structural unit of a and a structural unit of b is 1:1.

In Formula (14), Formula (17), Formula (19), and Formulae (25) to (27), a molar ratio between a structural unit of a, a structural unit of b', and a structural unit of b'' satisfies a relationship of a:(b'+b'')=1:1.

In Formulae (22) to (24), a molar ratio between a structural unit of a', a structural unit of a'', and a structural unit of b satisfies a relationship of (a'+a''):b=1:1.

In the molar ratio a:(b'+b'')=1:1 with respect to Formula (14), Formula (17), Formula (19), and Formulae (25) to (27), b'' may be 0 and the molar ratio between b' and b'' can be expressed as b':b''=(1−x):x (with proviso that $0 \leq x < 1$).

In the molar ratio (a'+a''):b=1:1 with respect to Formulae (22) to (24), any one of a' and a'' may be 0 and the molar ratio between a' and a'' can be expressed as a':a''=(1−x):x (with proviso that $0 \leq x \leq 1$).

Here, b'' is a unit contributing to the absorption at a wavelength of 193 nm. Accordingly, by varying the ratio between b' and b'', the k value at a wavelength of 193 nm can be controlled to become an objective value, and the k value at a wavelength of 193 nm can be lowered by lowering the ratio of b''.

Examples of the solvent contained in the composition of the present invention include one type of solvent or a mixture of two or more types of solvents selected from a group consisting of propylene glycol monomethyl ether (PGME), propylene glycol monomethyl ether acetate (PGMEA), propylene glycol monopropyl ether, methyl ethyl ketone, ethyl lactate, cyclohexanone, γ-butyrolactone, and N-methylpyrrolidone. Then, the content of the solvent in the composition of the present invention is, for example, 50% by mass or more and 99.5% by mass or less.

The content of the polymer contained in the composition of the present invention may be, for example, 0.5% by mass or more and 30% by mass or less, based on the mass of the resist underlayer film forming composition.

The composition of the present invention may contain besides the polymer and the solvent, a crosslinkable compound (crosslinker) and further a compound for accelerating a crosslinking reaction. When a component remaining after subtracting the solvent from the whole composition is defined as the solid content, the solid content contains the polymer and additives added if necessary, such as a crosslinkable compound and a compound for accelerating a crosslinking reaction. The content of the polymer in the solid content is, for example, 70% by mass or more and 98% by mass or less.

Examples of the crosslinkable compound include nitrogen-containing compounds having two to four nitrogen atoms substituted with a methylol group or an alkoxymethyl group, and the crosslinkable compound may be blended in the composition of the present invention in an amount of, for example, 1% by mass or more and 30% by mass or less, based on the mass of the polymer contained in the composition of the present invention. Specific examples of the crosslinkable compound include hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

The compound for accelerating a crosslinking reaction include, for example, a sulfonic acid compound and may also be a combination of an acid generator and a sulfonic acid compound. The compound for accelerating a crosslinking reaction may be blended in the composition of the present invention in an amount of, for example, 0.1% by mass or more and 10% by mass or less, based on the mass of the polymer contained in the composition of the present invention. Specific examples of the sulfonic acid compound include p-toluenesulfonic acid, trifluoromethanesulfonic acid, pyridinium-p-toluenesulfonic acid, camphorsulfonic acid, 5-sulfosalicylic acid, 4-chlorobenzenesulfonic acid, 4-hydroxybenzenesulfonic acid, benzenedisulfonic acid, and 1-naphthalenesulfonic acid. Specific examples of the acid generator include 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenylbenzylsulfonium hexafluoroantimonate, 3-benzylbenzothiazolium hexafluoroantimonate, 2,4,4,6-tetrabromocyclohexadienone, benzointosylate, and 2-nitrobenzyltosylate.

The composition of the present invention may further contain a surfactant and/or an adhesive assistant. The surfactant is an additive for enhancing the applicability of the composition to the substrate. As the surfactant, publicly known surfactants such as nonion-based surfactants and fluorinated surfactants may be used, and the surfactant may be blended in the composition of the present invention, for example, in an amount of 0.01% by mass or more and 0.5% by mass or less, based on the mass of the composition. The adhesive assistant has an object of enhancing the adhesion of the resist underlayer film with the substrate or the resist film and is an additive for suppressing the peeling of the resist film during the development after the exposure. Examples of the adhesive assistant include chlorosilanes, alkoxysilanes, silazanes, silanes, and heterocyclic compounds, and the adhesive assistant may be blended in the resist underlayer film forming composition of the present invention in an amount of, for example, 0.1% by mass or more and 2% by mass or less, based on the mass of the resist underlayer film forming composition.

The composition of the present invention can be applied to a lithography process in the production process of semiconductor devices. A resist pattern is formed through at least such processes as: a process for applying the composition of the present invention on a semiconductor substrate and baking the composition to form a resist underlayer film; a process for forming a resist film on the resist underlayer film; a process for exposing the semiconductor substrate coated with the resist underlayer film and the resist film to light; and a process for developing the resist film after the exposure.

The exposure is performed using, for example, an ArF excimer laser. Instead of the ArF excimer laser, EUV (wavelength: 13.5 nm) or an electron beam may also be used. The "EUV" is an abbreviation of the extreme ultraviolet. The resist for forming the resist film may be any one of a positive resist and a negative resist. As the resist, there can be used a chemical amplification-type resist photosensitive to an ArF excimer laser, EUV, or an electron beam.

A representative substrate of the above semiconductor substrate is a silicon wafer. However, as the semiconductor substrate, a silicon on insulator (SOI) substrate or a wafer of a compound semiconductor such as gallium arsenide (GaAs), indium phosphide (InP), and gallium phosphide (GaP) may also be used. There may also be used a semiconductor substrate on which an insulating film such as a silicon oxide film, a nitrogen-containing silicon oxide film (SiON film), and a carbon-containing silicon oxide film (SiOC film) is formed, and in this case, the composition of the present invention is applied on the insulating film.

EFFECTS OF THE INVENTION

The composition of the present invention contains a polymer having a repeating structure of Formula (1) or a polymer containing structural units of Formula (28) and Formula (29). Therefore, a resist underlayer film having high efficiency for lowering the k value and having a large selection ratio of a dry etching rate relative to a resist film without lowering the oxygen content can be obtained from the composition of the present invention. The backbone of the two-dimensional polymer (linear polymer) contained in the composition of the present invention has a C—O bond that is more easily broken by dry etching than a C—C bond, and thus, the composition of the present invention can obtain a resist underlayer film having a dry etching rate larger than that of a resist underlayer film obtained from a resist underlayer film forming composition using as the polymer, an acrylic resin or a methacrylic resin.

An alicyclic or aliphatic tetracarboxylic dianhydride which is one of raw material compounds for the polymer contained in the composition of the present invention is a compound having high oxygen content. Then, an alicyclic or aliphatic tetracarboxylic dianhydride generates two carboxy groups through a reaction thereof with an alcoholic compound. Therefore, these tetracarboxylic dianhydrides can be readily subjected to a condensation reaction with a diepoxy compound to be polymerized. As a result, the obtained polymer has high oxygen content and has an ester bond in the backbone thereof, and thus, the resist underlayer film obtained from the composition of the present invention can have a high dry etching rate. An alicyclic or aliphatic tetracarboxylic dianhydride has high transparency at a wavelength of 193 nm, and thus, by combining the alicyclic or aliphatic tetracarboxylic dianhydride with a light absorbing moiety to control an introduced amount of the alicyclic or aliphatic tetracarboxylic dianhydride, there can be obtained a resist underlayer film having a desired, relatively low k value (such as a value of 0.3 or less and more than 0) and an n value of more than 1.6. Accordingly, the composition of the present invention can be applied to an immersion lithography process using an immersion exposure apparatus having a large number of aperture (NA) of a projection lens and also to a so-called dry lithography process.

BEST MODES FOR CARRYING OUT THE INVENTION

Hereinafter, the present invention will be described more specifically referring to Synthesis Examples and Examples. However, the following Synthesis Examples and Examples should not be construed as limiting the scope of the present invention.

The weight average molecular weight shown in the following Synthesis Examples of the present specification is the result of the measurement by gel permeation chromatography (hereinafter, abbreviated as GPC). For the measurement, a GPC apparatus manufactured by Tosoh Corporation was used and the conditions for the measurement were as follows.
GPC column: Shodex (registered trademark), Asahipak (registered trademark) (Showa Denko K. K.)
Column temperature: 40° C.
Solvent: N,N-dimethylformamide (DMF)
Flow rate: 0.6 mL/min
Standard sample: polystyrene (Tosoh Corporation)
Detector: RI

EXAMPLES

Synthesis Example 1

9.00 g of monoallyldiglycidylisocyanuric acid (manufactured by Shikoku Chemicals Corporation) of Formula (9-a), 6.46 g of 1,2,3,4-cyclobutanetetracarboxylic dianhydride of Formula (7-a), and 0.61 g of ethyltriphenylphosphonium bromide were dissolved in 64.29 g of propylene glycol monomethyl ether, and the resultant solution was subjected to the reaction at 130° C. for 4 hours to produce a solution containing a polymer. The obtained polymer corresponds to a polymer containing a structural unit of Formula (13) (a:b=1:1 (molar ratio)) and was subjected to a GPC analysis. As the result of the analysis, the obtained polymer was found to have a weight average molecular weight of 7,400 in terms of standard polystyrene. 1,2,3,4-Cyclobutanetetracarboxylic dianhydride is obtained by applying a method described in, for example, Japanese Examined Patent Publication No. JP-B-2-61956 and Japanese Patent Application Publication No. JP-A-2003-192685.

Synthesis Example 2

20.00 g of monoallyldiglycidylisocyanuric acid (manufactured by Shikoku Chemicals Corporation), 7.06 g of 1,2,3,4-cyclobutanetetracarboxylic dianhydride, 5.55 g of 2,4-dihydroxybenzoic acid, and 1.34 g of ethyltriphenylphosphonium bromide were dissolved in 79.19 g of propylene glycol monomethyl ether, and the resultant solution was subjected to the reaction at 130° C. for 4 hours to produce a solution containing a polymer. The obtained polymer corresponds to a polymer containing a structural unit of Formula (14) (a:b':b"=2:1:1 (molar ratio)) and was subjected to a GPC analysis. As the result of the analysis, the obtained polymer was found to have a weight average molecular weight of 8,200 in terms of standard polystyrene.

Synthesis Example 3

8.00 g of monoallyldiglycidylisocyanuric acid (manufactured by Shikoku Chemicals Corporation), 6.04 g of 1,2,3,4-cyclopentanetetracarboxylic dianhydride (manufactured by Tokyo Chemical Industry Co., Ltd.) of Formula (7-d), and 0.53 g of ethyltriphenylphosphonium bromide were dissolved in 34.01 g of propylene glycol monomethyl ether, and the resultant solution was subjected to the reaction at 130° C. for 4 hours to produce a solution containing a polymer. The obtained polymer corresponds to a polymer containing a structural unit of Formula (15) (a:b=1:1 (molar ratio)) and was subjected to a GPC analysis. As the result of the analysis, the obtained polymer was found to have a weight average molecular weight of 10,000 in terms of standard polystyrene.

Synthesis Example 4

8.00 g of monoallyldiglycidylisocyanuric acid (manufactured by Shikoku Chemicals Corporation), 6.04 g of 1,2,3,4-cyclopentanetetracarboxylic dianhydride (manufactured by Tokyo Chemical Industry Co., Ltd.), and 0.53 g of ethyltriphenylphosphonium bromide were dissolved in 14.0 g of 1-hexanol and 20.00 g of cyclohexanone, and the resultant solution was subjected to the reaction at 130° C. for 4 hours to produce a solution containing a polymer. The obtained polymer corresponds to a polymer containing a structural unit of Formula (16) (a:b=1:1 (molar ratio)) and was subjected to a GPC analysis. As the result of the analysis, the obtained polymer was found to have a weight average molecular weight of 7,200 in terms of standard polystyrene.

Synthesis Example 5

20.00 g of monoallyldiglycidylisocyanuric acid (manufactured by Shikoku Chemicals Corporation), 7.56 g of 1,2,3,4-cyclopentanetetracarboxylic dianhydride (manufactured by Tokyo Chemical Industry Co., Ltd.), 5.55 g of 2,4-dihydroxybenzoic acid, and 1.34 g of ethyltriphenylphosphonium bromide were dissolved in 80.37 g of propylene glycol monomethyl ether, and the resultant solution was subjected to the reaction at 130° C. for 4 hours to produce a solution containing a polymer. The obtained polymer corresponds to a polymer containing a structural unit of Formula (17) (a:b':b"=2:1:1 (molar ratio)) and was subjected to a GPC analysis. As the result of the analysis, the obtained polymer was found to have a weight average molecular weight of 7,500 in terms of standard polystyrene.

Synthesis Example 6

8.00 g of monoallyldiglycidylisocyanuric acid (manufactured by Shikoku Chemicals Corporation), 7.26 g of bicyclo[2,2,2]octo-7-ene-2,3,5,6-tetracarboxylic dianhydride (manufactured by Tokyo Chemical Industry Co., Ltd.) of Formula (7-b), 0.54 g of ethyltriphenylphosphonium bromide, and 0.08 g of hydroquinone were dissolved in 63.24 g of propylene glycol monomethyl ether, and the resultant solution was subjected to the reaction at 130° C. for 4 hours to produce a solution containing a polymer. Hydroquinone is added in order to suppress a side reaction in which a double bond bond) of a tetracarboxylic dianhydride used in the present Synthesis Example is radical-polymerized. The obtained polymer corresponds to a polymer containing a structural unit of Formula (18) (a:b=1:1 (molar ratio)) and was subjected to a GPC analysis. As the result of the analysis, the obtained polymer was found to have a weight average molecular weight of 28,000 in terms of standard polystyrene.

Synthesis Example 7

20.00 g of monoallyldiglycidylisocyanuric acid (manufactured by Shikoku Chemicals Corporation), 8.93 g of bicyclo[2,2,2]octo-7-ene-2,3,5,6-tetracarboxylic dianhydride (manufactured by Tokyo Chemical Industry Co., Ltd.), 5.55 g of 2,4-dihydroxybenzoic acid, 1.34 g of ethyltriphenylphosphonium bromide, and 0.32 g of hydroquinone were dissolved in 84.32 g of propylene glycol monomethyl ether, and the resultant solution was subjected to the reaction at 130° C. for 4 hours to produce a solution containing a polymer. Hydroquinone is added in order to suppress a side reaction in which a double bond (C=C bond) of a tetracarboxylic dianhydride used in the present Synthesis Example is radical-polymerized. The obtained polymer corresponds to a polymer containing a structural unit of Formula (19) (a:b':b"=2:1:1 (molar ratio)) and was subjected to a GPC analysis (gel permeation chromatography). As the result of the analysis, the obtained polymer was found to have a weight average molecular weight of 19,000 in terms of standard polystyrene.

Synthesis Example 8

8.00 g of monoallyldiglycidylisocyanuric acid (manufactured by Shikoku Chemicals Corporation), 7.20 g of bicyclo[3,3,0]octane-2,4,6,8-tetracarboxylic dianhydride of Formula (7-e), and 0.53 g of ethyltriphenylphosphonium bromide were dissolved in 62.95 g of propylene glycol monomethyl ether, and the resultant solution was subjected to the reaction at 130° C. for 4 hours to produce a solution containing a polymer. The obtained polymer corresponds to a polymer containing a structural unit of Formula (20) (a:b=1:1 (molar ratio)) and was subjected to a GPC analysis. As the result of the analysis, the obtained polymer was found to have a weight average molecular weight of 71,000 in terms of standard polystyrene. Bicyclo[3,3,0]octane-2,4,6,8-tetracarboxylic dianhydride is obtained by applying a method described in, for example, Japanese Patent Application Publication No. JP-A-2000-159772.

Synthesis Example 9

8.00 g of monoallyldiglycidylisocyanuric acid (manufactured by Shikoku Chemicals Corporation), 5.70 g of meso-butane-1,2,3,4-tetracarboxylic dianhydride (manufactured by Tokyo Chemical Industry Co., Ltd.) of Formula (7-c), and 0.53 g of ethyltriphenylphosphonium bromide were dissolved in 57.00 g of propylene glycol monomethyl ether and the resultant solution was subjected to the reaction at 130° C. for 4 hours to produce a solution containing a polymer. The obtained polymer corresponds to a polymer containing a structural unit of Formula (21) (a:b=1:1 (molar ratio)) and was subjected to a GPC analysis. As the result of the analysis, the obtained polymer was found to have a weight average molecular weight of 7,500 in terms of standard polystyrene.

Example 1

With 10 g of a solution containing 2 g of the polymer obtained in Synthesis Example 1, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

Example 2

With 10 g of a solution containing 2 g of the polymer obtained in Synthesis Example 2, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

Example 3

With 10 g of a solution containing 2 g of the polymer obtained in Synthesis Example 3, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

Example 4

With 10 g of a solution containing 2 g of the polymer obtained in Synthesis Example 4, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

Example 5

With 10 g of a solution containing 2 g of the polymer obtained in Synthesis Example 5, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 µm and further filtered using a polyethylene microfilter having a pore diameter of 0.05 µm to prepare a resist underlayer film forming composition (solution).

Example 6

With 10 g of a solution containing 2 g of the polymer obtained in Synthesis Example 6, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 µm and further filtered using a polyethylene microfilter having a pore diameter of 0.05 µm to prepare a resist underlayer film forming composition (solution).

Example 7

With 10 g of a solution containing 2 g of the polymer obtained in Synthesis Example 7, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 µm and further filtered using a polyethylene microfilter having a pore diameter of 0.05 µm to prepare a resist underlayer film forming composition (solution).

Example 8

With 10 g of a solution containing 2 g of the polymer obtained in Synthesis Example 8, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 µm and further filtered using a polyethylene microfilter having a pore diameter of 0.05 µm to prepare a resist underlayer film forming composition (solution).

Example 9

With 10 g of a solution containing 2 g of the polymer obtained in Synthesis Example 9, 0.5 g of tetramethoxymethylglycoluril (manufactured by Nihon Cytec Industries Inc.; trade name: POWDERLINK (registered trademark) 1174) and 0.05 g of pyridinium-p-toluenesulfonic acid were mixed, and the resultant mixture was dissolved in 35.4 g of propylene glycol monomethyl ether and 18.6 g of propylene glycol monomethyl ether acetate to prepare a solution. Subsequently, the solution was filtered using a polyethylene microfilter having a pore diameter of 0.10 µm and further filtered using a polyethylene microfilter having a pore diameter of 0.05 µm to prepare a resist underlayer film forming composition (solution).

Comparative Example 1

There was prepared a resist underlayer film forming composition (solution) containing: a copolymer that has a structural unit of Formula (30) below as the polymer; and further a crosslinker of Formula (31) below and pyridinium-p-toluenesulfonic acid as the additives.

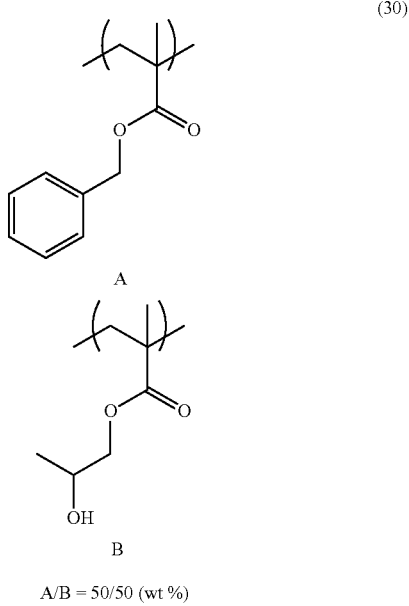

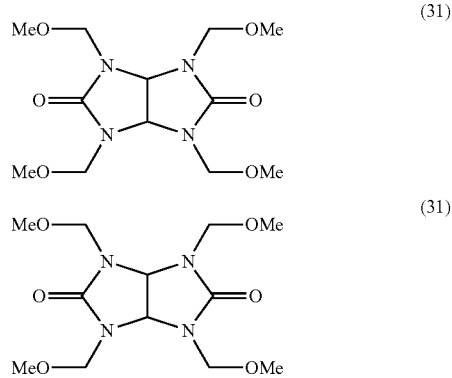

[Dissolution Test in Resist Solvent]

Each of the resist underlayer film forming compositions prepared in Examples 1 to 9 of the present invention was applied (spin-coated) on a silicon wafer using a spinner. The composition was baked on a hot plate at 205° C. for 1 minute to form a resist underlayer film (film thickness: 0.10 µm). The resist underlayer film was immersed in ethyl lactate and propylene glycol monomethyl ether which were a solvent for the resist solution and it was confirmed that the resist underlayer film was insoluble in the solvent.

[Test for Intermixing with Resist]

Each of the resist underlayer film forming compositions prepared in Examples 1 to 9 of the present invention was applied on a silicon wafer using a spinner. The composition was heated on a hot plate at 205° C. for 1 minute to form a resist underlayer film (film thickness: 0.10 μm).

As an upper layer of the resist underlayer film, a commercially available resist solution (manufactured by JSR Corporation; trade name: AR2772JN) was applied on the resist underlayer film using a spinner. The resist solution was heated on a hot plate at 110° C. for 1.5 minutes to form a resist film, and the resultant resist film was exposed to light using an exposure apparatus, followed by subjecting the resist film to the post exposure bake (PEB) at 110° C. for 1.5 minutes. The resist film was developed and thereafter, the film thickness of the resist underlayer film was measured, and thus, it was confirmed that there was caused no intermixing between each of the resist underlayer films obtained from the resist underlayer film forming compositions prepared in Examples 1 to 9 and the resist film.

[Test for Optical Parameter]

Each of the resist underlayer film forming compositions prepared in Examples 1 to 9 of the present invention and the resist underlayer film forming composition shown in Comparative Example 1 was applied on a silicon wafer using a spinner. The composition was heated on a hot plate at 205° C. for 1 minute to form a resist underlayer film (film thickness: 0.06 μm). Then, the refractive index n value and the attenuation coefficient k value at the wavelength of 193 nm of each of these ten types of resist underlayer films were measured using a spectroscopic ellipsometer (manufactured by J.A. Woollam Co., Inc.; VUV-VASE VU-302). The result of the measurement is shown in Table 1.

[Measurement of Dry Etching Rate]

Each of the resist underlayer film forming compositions prepared in Examples 1 to 9 of the present invention and the resist underlayer film forming composition shown in Comparative Example 1 was applied on a silicon wafer using a spinner. The composition was heated on a hot plate at 205° C. for 1 minute to form a resist underlayer film. Then, the dry etching rate (reduced amount of film thickness per unit time) of the resist underlayer film was measured using RIE system ES401 manufactured by Nippon Scientific Co., Ltd. under a condition of using $CF_4$ as a dry etching gas.

A resist solution (manufactured by Sumitomo Chemical Co., Ltd.; trade name: PAR710) was applied on a silicon wafer using a spinner and in the same manner as described above, a resist film was formed. Then, the dry etching rate of the resist film was measured using RIE system ES401 manufactured by Nippon Scientific Co., Ltd. under a condition of using $CF_4$ as a dry etching gas.

The dry etching rate of each of ten types of resist underlayer films obtained from the resist underlayer film forming compositions prepared in Examples 1 to 9 and Comparative Example 1 was compared with the dry etching rate of the resist film formed from the resist solution manufactured by Sumitomo Chemical Co., Ltd. The ratio of the dry etching rate of each of the resist underlayer films relative to the dry etching rate of the resist film (selection ratio of dry etching rate) is shown in Table 1.

TABLE 1

| | Refractive index (n value) | Attenuation coefficient (k value) | Wave length (nm) | Selection ratio of dry etching rate |
|---|---|---|---|---|
| Example 1 | 1.81 | 0.17 | 193 | 1.88 |
| Example 2 | 1.80 | 0.22 | 193 | 1.81 |
| Example 3 | 1.81 | 0.14 | 193 | 1.73 |
| Example 4 | 1.77 | 0.14 | 193 | 1.42 |
| Example 5 | 1.79 | 0.21 | 193 | 1.73 |
| Example 6 | 1.82 | 0.17 | 193 | 1.58 |
| Example 7 | 1.81 | 0.22 | 193 | 1.63 |
| Example 8 | 1.81 | 0.13 | 193 | 1.61 |
| Example 9 | 1.80 | 0.13 | 193 | 1.83 |
| Comparative Example 1 | 1.84 | 0.48 | 193 | 1.10 |

Each of the resist underlayer films obtained from the resist underlayer film forming compositions of Examples 1 to 9 corresponding to the composition of the present invention has a sufficiently effective refractive index and attenuation coefficient relative to a light of 193 nm and exhibited a k value lower than that of the resist underlayer film of Comparative Example 1. There was obtained the result that the resist underlayer film has a large selection ratio of a dry etching rate relative to the resist film and has a selection ratio of a dry etching rate larger than that of the resist underlayer film of Comparative Example 1.

In other words, the result shows that the resist underlayer film obtained from the resist underlayer film forming composition of the present invention can reduce the time required for removing the resist underlayer film by dry etching and can also suppress the decrease of the film thickness of the resist film on the resist underlayer film according to the removal of the resist underlayer film by dry etching.

[Formation and Evaluation of Resist Pattern]

Each of the resist underlayer film forming compositions prepared in Examples 1 to 9 of the present invention was spin-coated on a silicon wafer, and the composition was heated at 205° C. for 1 minute to form a resist underlayer film. A resist solution for an ArF excimer laser (manufactured by JSR Corporation; trade name: AR2772JN) was spin-coated on the resist underlayer film, and the solution was heated at 110° C. for 90 seconds to form a resist film. Then, the exposure was performed using an exposure apparatus for an ArF excimer laser (manufactured by ASML Holding N.V.; ASM 5500/1100), under a predetermined condition, and after the exposure, the resultant films were subjected to a post exposure bake (PEB) at 110° C. for 90 seconds, was cooled down to room temperature on a cooling plate, and was subjected to the development and the rinse treatment to form a resist pattern.

It was able to be confirmed that the objective resist pattern was formed by setting the objective line width to 80 nm line and space, measuring the resist pattern size under a condition of the optimal exposure amount and the optimal focus with a length measuring SEM, and observing the cross section shape of the resist pattern in a direction perpendicular to the substrate (silicon wafer) with a cross section SEM.

The invention claimed is:

1. A resist underlayer film forming composition for lithography comprising:
a polymer having a repeating structure of Formula (1):

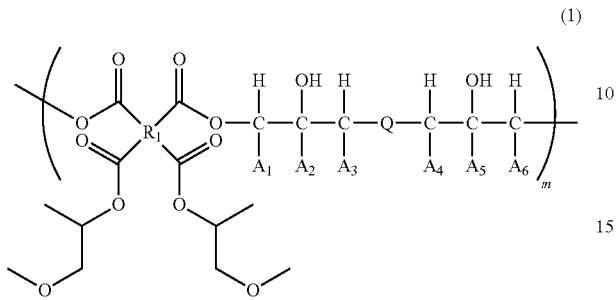

(1)

where $A_1, A_2, A_3, A_4, A_5,$ and $A_6$ are independently a hydrogen atom, a methyl group, or an ethyl group; Q is a divalent organic group; $R_1$ is a $C_{4-20}$ alicyclic structure or aliphatic structure; and m is the number of repeating units of 5 to 300; and
a solvent.

2. The resist underlayer film forming composition for lithography according to claim 1, wherein in Formula (1), Q is a group of Formula (2):

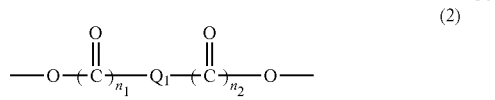

(2)

where $Q_1$ is a $C_{1-10}$ alkylene group, a divalent organic group having a $C_{3-10}$ alicyclic hydrocarbon, a phenylene group, a naphthylene group, or an anthrylene group, where the phenylene group, the naphthylene group, and the anthrylene group are each optionally substituted with at least one group selected from a group consisting of a $C_{1-6}$ alkyl group, a halogen atom, a $C_{1-6}$ alkoxy group, a nitro group, a cyano group, and a $C_{1-6}$ alkylthio group; and $n_1$ and $n_2$ are independently a number of 0 or 1.

3. The resist underlayer film forming composition for lithography according to claim 1, wherein in Formula (1), Q is a group of Formula (3):

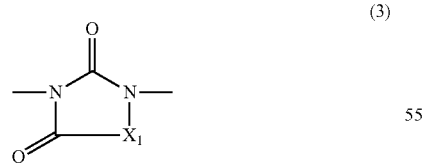

(3)

where $X_1$ is a divalent group of Formula (4) or Formula (5):

(4)

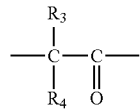

(5)

where $R_3$ and $R_4$ are independently a hydrogen atom, a $C_{1-6}$ alkyl group, a $C_{3-6}$ alkenyl group, a benzyl group, or a phenyl group, where the phenyl group is optionally substituted with at least one group selected from a group consisting of a $C_{1-6}$ alkyl group, a halogen atom, a $C_{1-6}$ alkoxy group, a nitro group, a cyano group, and a $C_{1-6}$ alkylthio group, or $R_3$ and $R_4$ are optionally bonded to each other to form a $C_{3-6}$ ring.

4. The resist underlayer film forming composition for lithography according to claim 1, wherein in Formula (1), Q is a group of Formula (6):

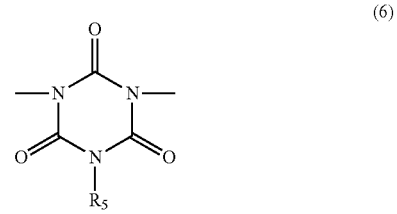

(6)

where $R_5$ is a $C_{1-6}$ alkyl group, a $C_{3-6}$ alkenyl group, a benzyl group, or a phenyl group, where the phenyl group is optionally substituted with at least one group selected from a group consisting of a $C_{1-6}$ alkyl group, a halogen atom, a $C_{1-6}$ alkoxy group, a nitro group, a cyano group, and a $C_{1-6}$ alkylthio group.

5. The resist underlayer film forming composition for lithography according to claim 1, wherein the polymer is a product of a reaction between at least one compound of Formula (7) below, a compound of Formula (8-o) below, and at least one compound of Formula (9) below:

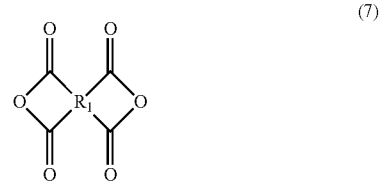

(7)

(8-o)

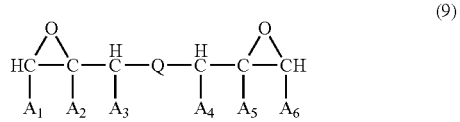

(9)

where $R_1$ is a $C_{4-20}$ alicyclic structure or aliphatic structure; $A_1, A_2, A_3, A_4, A_5$ and $A_6$ are independently a hydrogen atom, a methyl group, or an ethyl group; and Q is a divalent organic group.

6. The resist underlayer film forming composition for lithography according to claim 5, wherein in Formula (9), Q is a group of Formula (10):

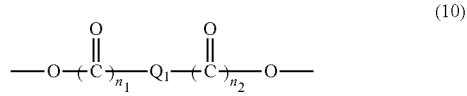

(10)

where $Q_1$ is a $C_1$-10 alkylene group, a divalent organic group having a $C_{3\text{-}10}$ alicyclic hydrocarbon, a phenylene group, a naphthylene group, or an anthrylene group, where the phenylene group, the naphthylene group, and the anthrylene group are each optionally substituted with at least one group selected from a group consisting of a $C_{1\text{-}6}$ alkyl group, a halogen atom, a $C_{1\text{-}6}$ alkoxy group, a nitro group, a cyano group, and a $C_{1\text{-}6}$ alkylthio group; and $n_1$ and $n_{,2}$ are independently a number of 0 or 1.

7. The resist underlayer film forming composition for lithography according to claim 5, wherein the compound of Formula (9) is a compound of Formula (11):

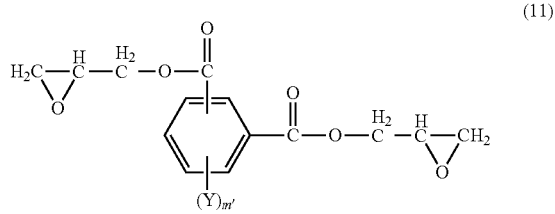

(11)

where Y is a $C_{1\text{-}6}$ alkyl group, a halogen atom, a $C_{1\text{-}6}$ alkoxy group, a nitro group, a cyano group, or a $C_{1\text{-}6}$ alkylthio group; and m' is an integer of 0 to 4, where when m' is 2 to 4, each Y is optionally the same as or different from each other).

8. The resist underlayer film forming composition for lithography according to claim 5, wherein in Formula (9), Q is a group of Formula (12):

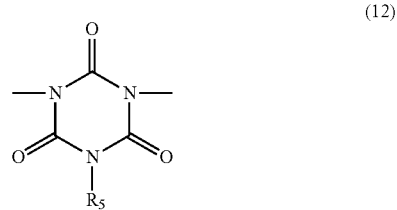

(12)

where $R_5$ is a $C_{1\text{-}6}$ alkyl group, $C_{3\text{-}6}$ alkenyl group, a benzyl group, or a phenyl group, where the phenyl group is optionally substituted with at least one group selected from a group consisting of a $C_{1\text{-}6}$ alkyl group, a halogen atom, a $C_{1\text{-}6}$ alkoxy group, a nitro group, a cyano group, and a $C_{1\text{-}6}$ alkylthio group.

9. The resist underlayer film forming composition for lithography according to claim 1, further comprising a crosslinkable compound.

10. The resist underlayer film forming composition for lithography according to claim 9, further comprising a compound for accelerating a crosslinking reaction.

11. The resist underlayer film forming composition for lithography according to claim 10, wherein the compound for accelerating a crosslinking reaction is a sulfonic acid compound selected from the group consisting of p-toluenesulfonic acid, trifluoromethanesulfonic acid, pyridinium-p-toluenesulfonic acid, camphorsulfonic acid, 5-sulfosalicylic acid, 4-chlorobenzenesulfonic acid, 4-hydroxybenzenesulfonic acid, benzenedisulfonic acid, and 1-naphthalenesulfonic acid.

12. The resist underlayer film forming composition for lithography according to claim 10, wherein the compound for accelerating a crosslinking reaction is a combination of an acid generator and a sulfonic acid compound selected from the group consisting of p-toluenesulfonic acid, trifluoromethanesulfonic acid, pyridinium-p-toluenesulfonic acid, camphorsulfonic acid, 5-sulfosalicylic acid, 4-chlorobenzenesulfonic acid, 4-hydroxybenzenesulfonic acid, benzenedisulfonic acid, and 1-naphthalenesulfonic acid.

13. The resist underlayer film forming composition for lithography according to claim 9, wherein the crosslinkable compound is a nitrogen-containing compound having two to four nitrogen atoms substituted with a methylol group or an alkoxymethyl group.

14. A forming method of a resist pattern used for the production of a semiconductor device, comprising:
    applying the resist underlayer film forming composition for lithography as claimed in claim 1 on a semiconductor substrate and baking the composition to form a resist underlayer film;
    forming a resist film on the resist underlayer film;
    exposing the semiconductor substrate coated with the resist underlayer film and the resist film to light; and
    developing the resist film after the exposure.

15. The forming method of a resist pattern according to claim 14, wherein the exposure is performed using an ArF excimer laser.

16. A resist underlayer film forming composition for lithography comprising:
    a polymer containing structural units of Formula (28) and Formula (29):

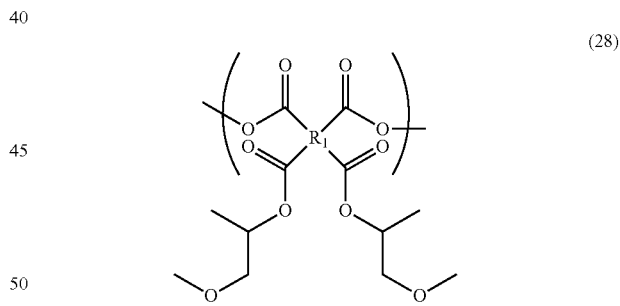

(28)

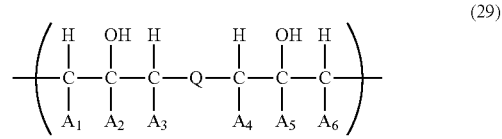

(29)

in Formula (28), $R_1$ is a $C_{4\text{-}20}$ alicyclic structure or aliphatic structure; and in Formula (29), $A_1$, $A_2$, $A_3$, $A_4$, $A_5$, and $A_6$ are independently a hydrogen atom, a methyl group, or an ethyl group; and Q is a divalent organic group; and a solvent.

17. The resist underlayer film forming composition for lithography according to claim 16, wherein in Formula (29), Q is a group of Formula (2):

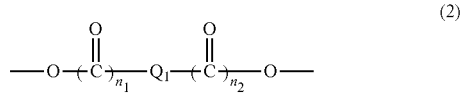

(2)

where $Q_1$ is a $C_1$-10 alkylene group, a divalent organic group having a $C_{3\text{-}10}$ alicyclic hydrocarbon, a phenylene group, a naphthylene group, or an anthrylene group, where the phenylene group, the naphthylene group, and the anthrylene group are each optionally substituted with at least one group selected from a group consisting of a $C_{1\text{-}6}$ alkyl group, a halogen atom, a $C_{1\text{-}6}$ alkoxy group, a nitro group, a cyano group, and a $C_{1\text{-}6}$ alkylthio group; $n_1$ and $n_2$ are independently a number of 0 or 1.

18. The resist underlayer film forming composition for lithography according to claim 16, wherein in Formula (29), Q is a group of Formula (3):

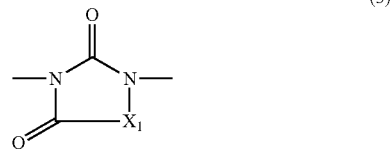

(3)

where $X_1$ is a divalent group of Formula (4) or Formula (5):

(4)

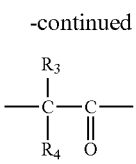

(5)

where $R_3$ and $R_4$ are independently a hydrogen atom, a $C_{1\text{-}6}$ alkyl group, a $C_{3\text{-}6}$ alkenyl group, a benzyl group, or a phenyl group, where the phenyl group is optionally substituted with at least one group selected from a group consisting of a $C_{1\text{-}6}$ alkyl group, a halogen atom, $C_{1\text{-}6}$ alkoxy group, a nitro group, a cyano group, and a $C_{1\text{-}6}$ alkylthio group, or $R_3$ and $R_4$ are optionally bonded to each other to form a $C_{3\text{-}6}$ ring.

19. The resist underlayer film forming composition for lithography according to claim 16, wherein in Formula (29), Q is a group of Formula (6):

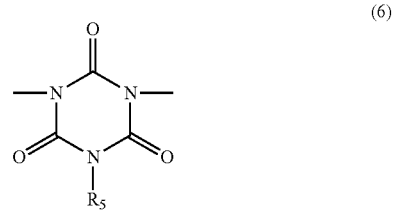

(6)

where $R_5$ is a $C_{1\text{-}6}$ alkyl group, a $C_{3\text{-}6}$ alkenyl group, a benzyl group, or a phenyl group, where the phenyl group is optionally substituted with at least one group selected from a group consisting of a $C_{1\text{-}6}$ alkyl group, a halogen atom, a $C_{1\text{-}6}$ alkoxy group, a nitro group, a cyano group, and a $C_{1\text{-}6}$ alkylthio group.

* * * * *